United States Patent
Yang et al.

(10) Patent No.: US 7,385,535 B2
(45) Date of Patent: Jun. 10, 2008

(54) DECODING SYSTEM AND METHOD BASED ON CONTEXT-BASED ADAPTIVE BINARY ARITHMETIC CODING

(75) Inventors: Kai Yang, Shenzhen (CN); Lin Wang, Shenzhen (CN); Yi Lin, Shenzhen (CN); Wei Yu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 11/580,734

(22) Filed: Oct. 12, 2006

(65) Prior Publication Data

US 2007/0080832 A1    Apr. 12, 2007

(30) Foreign Application Priority Data

Oct. 12, 2005    (CN) .................. 2005 1 0112735

(51) Int. Cl.
*H03M 7/00* (2006.01)
(52) U.S. Cl. .................. 341/107; 341/50; 341/51
(58) Field of Classification Search .............. 341/50, 341/51, 107; 375/242, 240.25; 717/141; 382/247
See application file for complete search history.

(56) References Cited

U.S. PATENT DOCUMENTS

| | | | |
|---|---|---|---|
| 5,471,206 A * | 11/1995 | Allen et al. | 341/51 |
| 5,583,500 A * | 12/1996 | Allen et al. | 341/107 |
| 5,717,394 A * | 2/1998 | Schwartz et al. | 341/51 |
| 2004/0258162 A1* | 12/2004 | Gordon et al. | 375/240.25 |
| 2004/0268329 A1* | 12/2004 | Prakasam | 717/141 |
| 2005/0001746 A1 | 1/2005 | Sankaran | |
| 2005/0175250 A1* | 8/2005 | Watanabe et al. | 382/247 |
| 2006/0023795 A1* | 2/2006 | Kim | 375/242 |

FOREIGN PATENT DOCUMENTS

| CN | 1650636 | 8/2005 |
|---|---|---|
| JP | 2005237004 | 9/2005 |

OTHER PUBLICATIONS

Wiegand et al. "Draft ITU-T Recommendation and Final Draft International Standard of Joint Video Specification (ITU-T Rec. H.264 | ISO/IEC 14496-10 AVC)". *Joint Video Team (JVT) of ISO/IEC MPEG & ITU-T VCEG (ISO/IEC JTC1/SC29/WG11 and ITU-T SG16 Q.6)*. 8th Meeting: Geneva, Switzerland, May 23-27, 2003.

* cited by examiner

Primary Examiner—Jean B Jeanglaude
(74) Attorney, Agent, or Firm—Merchant & Gould P.C.

(57) ABSTRACT

A CABAC decoding system includes at least a decoding unit group. Each decoding unit group includes N decoding units connected with each other. The $M^{th}$ decoding unit receives parameter information for decoding bins and bit streams to be decoded, decodes the bins of the bit streams to be decoded, obtains the decoding result of the current decoding unit bin, and sends the updated parameter information to the $(M+1)^{th}$ decoding unit and an output unit. The CABAC decoding system achieves high decoding rate and keeps a reasonable cost of hardware resource, and thereby provides a high efficient and reasonable decoding solution.

31 Claims, 6 Drawing Sheets

DECODING SYSTEM AND METHOD BASED ON CONTEXT-BASED ADAPTIVE BINARY ARITHMETIC CODING

FIELD OF THE INVENTION

The present invention relates to video coding and decoding techniques, and more particularly, to a decoding system and a method based on context-based adaptive binary arithmetic coding.

BACKGROUND

Context-Based Adaptive Binary Arithmetic Coding (CABAC) is one of the two entropy-coding schemes adopted in the International video coding standard H.264, and has higher compressive efficiency than the other entropy-coding scheme, namely Context-based Adaptive Variable Length Coding (CAVLC).

The function of an entropy coder is to code the values of all syntax elements in each macro block (MB) into code streams successively according to the MB scanning order. Here, the MB is a basic unit block for video image coding. Each image to be coded is divided into several MBs and further processed by encoding. The video coding standard H.264 supports two kinds of basic MB scanning orders.

Generally, the CABAC encoding process includes three primary parts, i.e. binarization, selection and update of context probability model, and binary arithmetic coding.

Particularly, the binarization is a pre-processing procedure for the syntax elements prior to encoding. The value of each syntax element is mapped into a binary character string including '0's and '1's according to a certain mapping rule. The mapping rule may vary depending on the nature of syntax elements.

Further, the binary arithmetic coder performs coding on the basis of the probability estimation value PLPS of the bin (the basic bit for CABAC coding and decoding) to be encoded, wherein, the context probability model is defined for the calculation of the PLPS. Concretely, the probability estimation of a bin to be '0' or '1' is performed before the bin is encoded. If the probability of '0' is greater than that of '1', the most probable symbol (MPS) is set to '0' and the least probable symbol (LPS) is set to '1'; otherwise, MPS is set to '1' and LPS is set to '0'. PLPS is the probability estimation value of a bin value being LPS. The range value of PLPS is 0 through 0.5. During the CABAC encoding process, a corresponding context probability model for every bin is set. Each context probability model contains a state value and an MPS value, and the state indicates the PLPS. The information of the adjacent left and top MBs that have been encoded is utilized to calculate the context probability model for the encoding of the bins of the current MB. The calculation rules are detailedly specified in the documents JVT-G050 for H.264 standard, "Draft ITU-T Recommendation H.264 and Draft ISO/IEC 14496-10 AVC" in JVT of ISO/IEC doc, T. Wig, Ed., Pattaya, Thailand, March 2003. It is ready to perform binary arithmetic coding for the bins after the selection of the context probability models.

The basic principle of the binary arithmetic coding process is to encode the source data with a real number between 0 and 1. The length of the real number depends on the probability of the source symbol sequence. Two basic parameters are used during the arithmetic coding process: the probability estimation values of the symbols and the current interval. The detailed encoding method is to set the current interval to [0,1] firstly, and then to encode or decode each bin. The encoding or decoding of each bin repeats the following process: a. subdivide the current interval to several subintervals, the length of each subinterval is proportional to the probability estimation value of each symbol maybe inputted; and b. choose the subinterval corresponding to the symbol that actually occurs as the new current interval.

In the above encoding process, the current interval becomes smaller and smaller because of the recursive interval subdivisions. To keep the calculation precision, a renormalization process is performed whenever the length of the current interval is smaller than 0.5 after the procedure b completes, to ensure the length of the current interval is always bigger than 0.5 when the next symbol is encoded.

The renormalization process is shown as below:
1. calculating the probability value $P_{LPS}$ of the least probable symbol;
2. calculating the coding intervals $R_{LPS}$ and $R_{MPS}$ separately corresponding to the least probable symbol (LPS)) and the most probable symbol (MPS), details as follows:

$$R_{LPS} = Range_i * P_{LPS};$$

$$R_{MPS} = Range_i - R_{LPS};$$

where, $Range_i$ is the range value of the decoding interval.

3. calculating the new interval value:
If the current input bin is corresponding to the value of LPS, then:

$$Range_{i+1} = R_{LPS};$$

$$Offset_{i+1} = Offset_i + R_{LPS};$$

where, $Offset_i$ is the offset value in decoding process.
If the current input bin is corresponding to the value of MPS, then:

$$Range_{i+1} = R_{LPS};$$

4. updating the probability value $R_{LPS}$ of the least probable symbol LPS;
5. outputing the decoding result, and renormalize the coding interval $Range_{i+1}$.

The CABAC implementation process is carried out with integer precision. Both the lower bound of the current subinterval $Offset_i$ and the range of the subinterval $Range_i$ are all in 9 bits integer precision. The renormalization process ensures the 8th bit, the highest bit of $Range_i$, is always 1.

It is shown from the formula above that the value of $Range_i * P_{LPS}$ is required by the binary arithmetic coder. To decrease the implementation complexity, the value is not directly calculated by the multiplication of the probability value of the least probable symbol $P_{LPS}$ and the $Range_i$, on the other hand, all the possible values are stored in a 2-dimension table and the expected value is obtained by querying the table. The index of the table includes a 6-bit value STATE and a 2-bit value qCodIRangeIdx. The 6-bit value is got from $P_{LPS}$ which is corresponding to the context probability model, while the 2-bit value is obtained from the 6th and 7th bits of $Range_i$, that is, the 2 highest bits except the 8th bit. The range of the 6-bit value STATE is from 0 to 63, and the range of the 2-bit value qCodIRangeIdx is from 0 to 3.

After the bin is encoded, the context probability model needs to be updated according to the value of the current bin encoded. The transition of the MPS value takes place only when the current bin is LPS and the state value before encoding is 0. Otherwise, it is kept unchanged. The transition is performed by changing the MPS value from 0 to 1, or from 1 to 0.

The CABAC arithmetic is formally presented in the JVT (ITU-T international video organization MPEG associated group) conference in 2003. So far, the corresponding CABAC decoders are mainly software or software/hardware based decoding structures.

At present there is a software-based CABAC decoder, of which the decoding process is performed by PC according to the arithmetic flow. Therefore, in the software-based CABAC decoder it is CPU that takes on the whole decoding task, which results in awfully slow decoding rate that can't meet the demand of real time applications.

At present there is another solution that provides software/hardware based decoding architecture, wherein, the hardware component contains the hardware architecture to decode a single bin, and in the hardware architecture one cycle one bin is adopted for the decoding of each bin.

It can be shown that the solution with hardware acceleration of one-cycle-one-bin improves the decoding efficiency greatly compared with the above software-based decoding solution.

SUMMARY OF THE INVENTION

The present invention provides a context-based adaptive binary arithmetic coding (CABAC) decoding system, including at least a decoding unit group. Each decoding unit group may include N decoding units interconnected with each other. According to the embodiments, a $M^{th}$ decoding unit is configured to receive parameter information for decoding bins and bit streams to be decoded, decode the bins in the bit streams to be decoded, obtain a bin decoding result of a current decoding unit, and send updated parameter information to a $M+1^{th}$ decoding unit, where, N is an integer no smaller than 2, M is an integer that is no smaller than 1 but no larger than N−1.

According to an embodiment, the above each decoding unit group further includes an output unit, wherein the decoding result of said $M^{th}$ decoding unit bin and the updated parameter information are sent to said output unit, and said output unit is configured for receiving control signals, decoding results and updated parameter information sent by the respective decoding units, selecting parameter information from the updated parameter information outputted by the decoding units, and selecting an output of the decoding unit group from the updated parameter information by the control signals.

According to an embodiment, the above decoding unit group includes a unit group for decoding regular coding mode bins and/or a unit group for decoding bypass coding mode bins.

Particularly, the parameter information may include interval value, offset value and value of probability models of each decoding unit.

According to an embodiment, when said decoding units include units for decoding regular coding mode bin, the $M^{th}$ unit for decoding regular coding mode bins outputs updated interval value and offset value, and sends the updated values to the $M+1^{th}$ unit for decoding regular coding mode bins as input interval and offset information.

According to an embodiment, the CABAC decoding system further includes a renormalization processing module, for performing renormalization on the interval value and the offset value outputted by the $M^{th}$ unit for decoding regular coding mode bins, and sending the renormalized interval value and the offset value to the $M+1^{th}$ unit for decoding regular coding mode bins or bypass coding mode bins as input interval and offset information.

According to an embodiment, the CABAC decoding system further includes a multi-selector, wherein an input of the multi-selector is a updated probability model outputted by the $M^{th}$ unit for decoding regular coding mode bins and/or a new probability model, and an output is a one selected from the two input probability models.

According to an embodiment, when said decoding units include units for decoding bypass coding mode bins, the updated interval and offset values outputted by the $M^{th}$ unit for decoding bypass coding mode bins or regular coding mode bins are sent to the $M+1^{th}$ unit for decoding bypass coding mode bins as input interval and offset values.

According to an embodiment, the decoding units are interconnected with each other by binary tree connections or serial connections.

In another aspect, the present invention provides a context-based adaptive binary arithmetic coding (CABAC) decoding method, implemented by at least a decoding unit group, each of the at least a decoding unit group including N decoding units interconnected with each other. The present method includes receiving parameter information and control signals for decoding bins by an $M^{th}$ decoding unit, decoding an input bit stream to be decoded based on said parameter information, outputting a decoding result of bins, and sending updated parameter information to an $M+1^{th}$ decoding unit, where, N is an integer no smaller than 2, M is an integer no smaller than 1 but no larger than N−1.

According to an embodiment, the CABAC decoding method further includes sending the decoding result and updated parameter information of the $M^{th}$ decoding unit bin to an output unit, and said output unit selecting parameter information from the updated parameter information outputted by the decoding units according to control signals and the bin decoding result, selecting output values of said decoding unit group from the updated parameter information according to the control signals and the decoded bin value.

Particularly, the decoding may include decoding regular coding mode bins and/or decoding bypass coding mode bins.

Further, the parameter information may include interval value, offset value and probability model values of each decoding unit.

According to an embodiment, the CABAC decoding method further includes said decoding unit determining whether the decoding is processed on regular coding mode bins or bypass coding mode bins according to a first control signal.

According to an embodiment, the CABAC decoding method further includes determining a decoding unit that is processing current decoding according to a second control signal, when decoding regular coding mode bins.

According to an embodiment, the CABAC decoding method further includes the decoding unit determining to select the updated probability model of the $M^{th}$ bin decoding unit or the new probability model as the probability model for the $M+1^{th}$ bin for decoding according to a third control signal.

According to an embodiment, the CABAC decoding method further includes calculating the updated probability model of the $M^{th}$ decoding unit while perform decoding by the $M^{th}$ decoding unit; obtaining probability model index information based on said updated probability model; and selecting one from the updated probability model index information obtained after decoding by the $M^{th}$ decoding unit and probability model index information inputted from outside as the updated probability model index information required by the $M+1^{th}$ decoding unit.

According to an embodiment, the CABAC decoding method further includes said decoding unit determining whether to decode positive and negative sign information in current decoding period according to a fourth introduced control signal.

According to an embodiment, when said decoding unit is determined to decode bypass coding mode bins, the present method further includes determining to decode a prefix or a suffix of Exp-Golomb code according to value of the said first control signal, wherein if decoding the prefix, the decoding process finishes when the decoded value of the bypass mode bin is 0; if decoding the suffix, determine the number of the bypass coding mode bins to be decoded according to a fifth control signal that is introduced to determine the number of the bypass coding mode bins to be decoded in the current decoding clap.

According to an embodiment, during the decoding process of bins, the decoding result includes sign information if there is a sign to be decoded.

According to an embodiment, the CABAC decoding method further includes performing renormalization on the updated interval and offset values by a renormalization processing module, and obtaining the renormalized interval and offset values as a final updated values of the decoding unit to be interval and offset values of inputs of other decoding units in a same clap or a final output value in the clap.

Particularly, the N decoding units are interconnected with each other by binary tree connections or serial connections.

It can be shown from the technical solution provided by the present invention that the present invention has higher decoding efficiency compared with the existing one cycle one bin decoding structure. Meanwhile, the present invention not only achieves the fast decoding, but also keeps the cost of the hardware resource in a reasonable scope during the decoding process. So, the present invention provides a high efficient and reasonable decoding system.

DETAILED DESCRIPTION OF THE PREFERRED EMBODIMENTS

The embodiments of the present invention provide a multi-level CABAC decoding hardware structure by utilizing characteristics of the CABAC decoding, which may decode two or more bins in one cycle (timing period) by hardware to implement parallel processing by the arithmetic decoding units. The present invention is advantageous in high efficiency of decoding by hardware.

According to the embodiments of the present invention, a multi-level decoding tree structure that can decode multiple bins in one clap (one cycle) is introduced to accelerate the decoding rate. That is, a plurality (at least 2) of decoding units that may decode a single bin separately is adopted, and more particularly, the decoding units in the multi-level decoding tree structure, each of which may separately decode a single bin, are concatenated for decoding multiple bins in one clap. Compared to that there is only one decoding unit in the prior decoding structures that can decode only one bin in one clap, the scheme of the present invention can make better use of the advantage of hardware based decoding, i.e., improving the decoding effectiveness greatly.

In the CABAC decoding process, three syntax elements (parameter information), i.e. the mvd (motion vectors) and level (residual coefficients) and the map_last (position information), are frequently decoded, so the decoding of these syntax elements is the emphasis of hardware acceleration.

The binarization bin string of the absolute value of the mvd and level contains a prefix and suffix Golomb code. The prefix is a unary code whose mapping rule is 0 to 0, 1 to 10, 2 to 110 and 3 to 1110, and so on. The suffix Golomb code contains its own prefix part and suffix part. The prefix of the Golomb code is a unary code, and the suffix of the Golomb code is a binarization bin string whose length is determined by the prefix of the Golomb code, for example, if the suffix of the mvd is $3^{rd}$ order Exp-Golomb, the length of the Golomb suffix is the length of the Golomb prefix plus 2; if the suffix of the level is $1^{st}$ order Exp-Golomb, the length of the Golomb suffix is the length of the Golomb prefix minus 1. If the mvd isn't equal to 0, there is one bin after its absolute value for indicating its sign information; to all the levels (the absolute value of the nonzero residual coefficients minus 1), one bin is appended to the binarization bin string of its absolute value to indicate the sign information.

The binarization of map_last is as follows: the map and the last occur in pair. Each of them may be a bin. If the map equals to 0, then there is no 'last' information; otherwise, the map is followed by a bin of last information.

To achieve fast decoding of the mvd and level and the map_last, two basic multi-level decoding structures are provided according to the embodiments of the present invention, which are respectively shown below.

Figure 1:
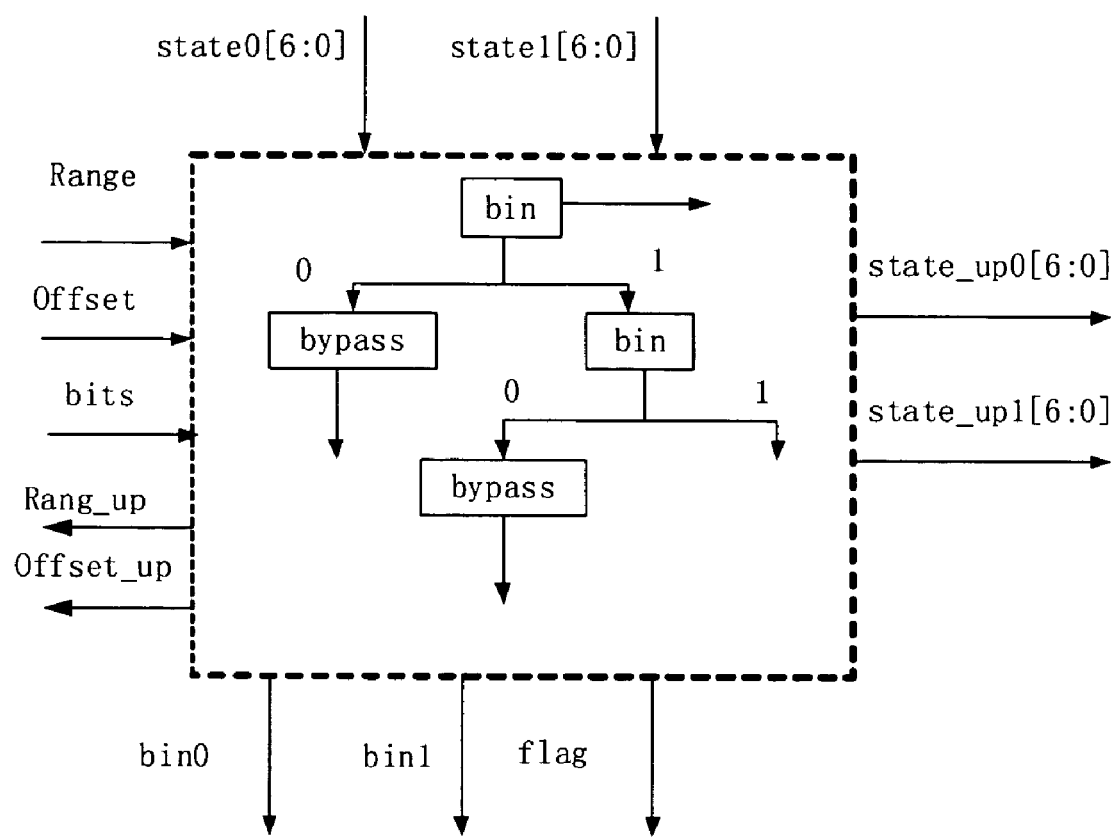
FIG. 1 is a schematic diagram showing the decoding structure of a 2-level tree for decoding regular coding mode bins according to an embodiment of the present invention.
Figure 6:
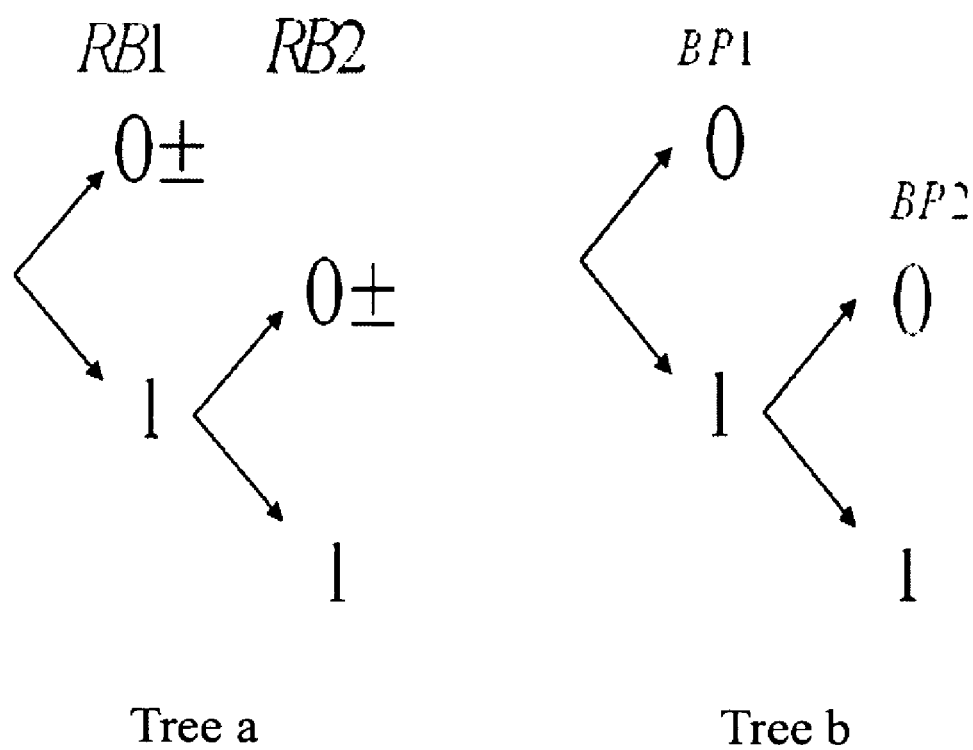
FIG. 6 is a schematic tree diagram showing the decoding process according to an embodiment of the present invention.

The first structure is shown as FIG. 1. The instance of the structure only decodes two bins in one clap. Two units that can decode regular coding mode bins are set in the structure, after each of the units there is a unit that can decode the bins in bypass coding mode. A simpler schematic diagram is shown in FIG. 6 (tree a). The structure can be used to accelerate the decoding of the prefix of the mvd and level and the map_last pair.

The input information of the above structure includes decoding interval value Rang and offset value Offset for arithmetic encoding or decoding as well as code stream bits to be decoded, and also includes state0 and state1 representing context information which maybe used to respectively denote the context during processes of decoding the above two bins.

The output signals of the structure include the updated Range and updated Offset (that is, Range_up and Offet_up), the updated context information (that is, state_up0 and state_up1), and the values of the 2 bins (bin0 and bin1) obtained by decoding the stream. If the sign bit is decoded, the outputs also include a flag, the indication of the sign bit information.

Figure 2:
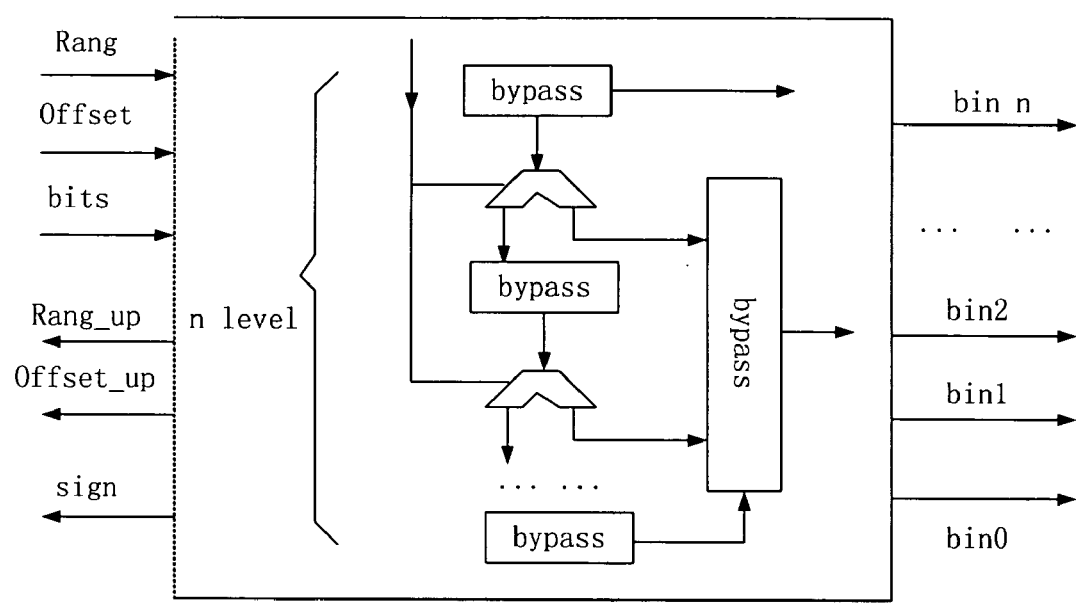
FIG. 2 is a schematic diagram showing a multi-level circuit decoding structure for decoding bypass coding mode bins according to an embodiment of the present invention.

Two units that can decode bins in bypass coding mode are set in the second structure. The units perform fast decoding of the suffix of the mvd and level. The structure is shown in FIG. 2, and a simpler schematic diagram is shown in FIG. 6 (tree b). The structure can decode the coefficients by Golomb method. The characteristic of the decoding circuit is that no maintenance information for the context is needed. This circuit is used to decode the prefix or the suffix of the Golomb codes. The circuit includes n bypass (bypass coding mode) decoding circuits, wherein n is equal or larger than 2, and the value of n can be set freely as required, such as 2,3,4, or 5 etc.

The bin string obtained by the binarization of the mvd and level may include a prefix and a suffix. Usually the value of the syntax element level and mvd is small, and the bin string of it only includes a prefix. The prefix includes several regular coding mode bins and a bypass mode bin (a positive/negative sign bit) at the end. The circuit structure as shown in FIG. 1 can perform the decoding function.

Sometimes the value of the syntax elements of the level and the mvd is large, and then a suffix will be involved in the decoding process. The suffix includes several bypass coding mode bins and a bypass mode bin (a positive/negative sign bit) at the end. The circuit structure as shown in FIG. 2 can be used to decode the suffix.

The decoding of the map_last pair can be performed directly by a unit that does not support the decoding of bypass coding mode bins, for example, the structure shown as FIG. 1. This can be achieved by choosing the output of the unit for decoding the regular coding mode bin as the final output of the clap.

The binarization of all other syntax elements except mvd, level and map_last is a regular coding mode bin string, which is a small part in a macroblock. So, no special acceleration is need for it, and decoding a bin in a clap is enough for its corresponding decoding process. In this case, a unit for decoding the regular coding mode bin as in FIG. 1 is directly employed.

Regarding the structure shown in FIG. 1, if it decodes 2 bins synchronously, and it deals with the update of the probability model, the detailed implementation of the circuit and its working principle are particularly illuminated as follows.

According to the embodiments of the present invention, the coding interval rLPS corresponding to the low probability symbol LPS is not directly got through querying the 2 dimension table 2, but first using the 6-bit state value as an index to get a set of 4 rLPS values in the 2 dimension table, wherein, the state includes 64 values, the 2 range bits includes 4 values. Then the combination of the state and 2 range bits can index 256 values of rLPS totally. Here the state is used as the first index to get a set of 4 rLPSs that are corresponding to the 4 rLPSs using the 2 range bits as the second index, and the 4 values need to be prepared in the former clap, marked as rlpsg, and named the probability model index information. In the current decoding clap the rLPS value is picked out from the rlpsg with the 2 range bits through a multi-selector MUX.

Figure 3:
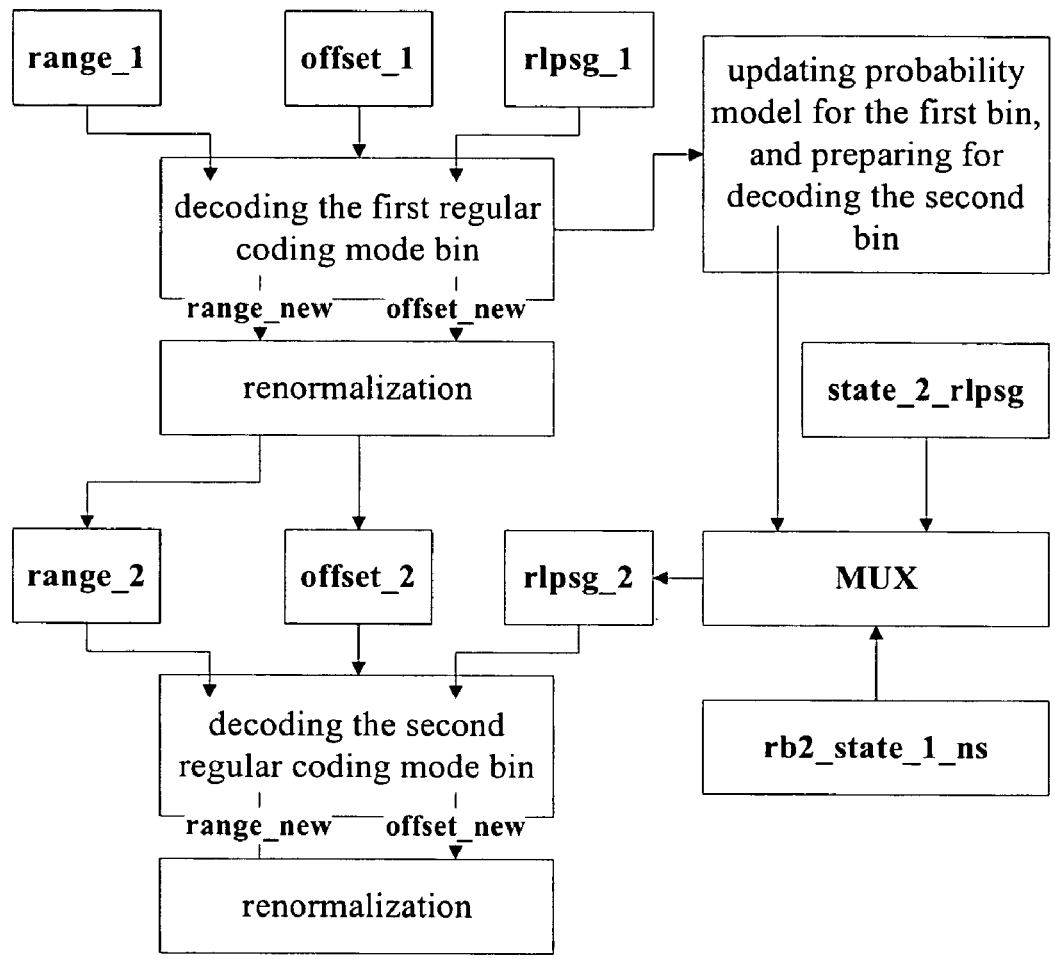
FIG. 3 is a schematic diagram showing a 2-level tree structure of concatenating 2 decoding units for decoding a single regular coding mode bin according to an embodiment of the present invention.

A correlated 2-level tree structure which concatenates 2 decoding units for decoding a regular coding mode bin is shown as FIG. 3. The decoding units include several units for decoding the regular coding mode bins, a renormalization process module and a multi-selector MUX. The units for decoding the regular coding mode bins include a unit for decoding the first regular coding mode bin and a unit for decoding the second regular coding mode bin.

The input information rlpsg of the decoding unit for regular coding mode bins contains the context information to decode the corresponding bin. The context information are got by querying the table using the 6-bit state values as index and can be obtained in the former clap. It can be seen that renormalization for the updated range_new and offset_new is needed after the decoding of the first bin is over. The updating values of the range and the offset after renormalization are the input for the decoding of the second bin.

The probability model for decoding the second bin may be the same one for decoding the first bin, or may be another probability model. So, in FIG. 3, a multi-selector MUX is used to select the really wanted rlpsg for decoding the second bin from a rlpsg that is updated with the probability model of the first bin and prepared for decoding the second bin and a state_2_rlpsg corresponding to the other probability model. Which one is selected is determined by the control signal rb2_state_1_ns, as will be described later.

To decrease the delay, the process of updating the probability model of the first bin and preparing the rlpsg for decoding the second bin are carried out synchronously with the decoding process of the first bin. The update of the corresponding context probability model doesn't have to be performed after the decoding of the first bin completes. Two sets of possible results are pre-calculated: when the first bin is MPS, one set of probability model index information includes state1_ns_ifMPS, the updated value of state1, and the 4 rLPS values state1_ns_ifMPS_rlpsg obtaining by using the updated value of state1 as index; when the first bin is LPS, the other set of probability model index information includes state1_ns_ifLPS, the updated value of state1, and the 4 rLPS values state1_ns_ifLPS_rlpsg obtaining by using the updated value of state1 as index. The calculation process happens synchronously with the decoding process of the first bin, so the key path delay can be decreased.

The updated rlpsg is selected from the 2 sets of state1_ns_ifMPS_rlpsg and state1_ns_ifLPS_rlps according to the decoded value from the first bin as the input information (that is, the updated probability model index information of the decoding unit for the first bin) of next level decoding unit. If the probability model for decoding the second bin is the same as the one for decoding the first bin, multi-selector will choose the rlpsg updated with the decoding result of the first bin as the rlpsg_2 required by the decoding of the second bin, otherwise, multi-selector will choose the state_2_rlpsg prepared by the other probability model as the rlpsg_2 required by the decoding of the second bin.

Figure 4:
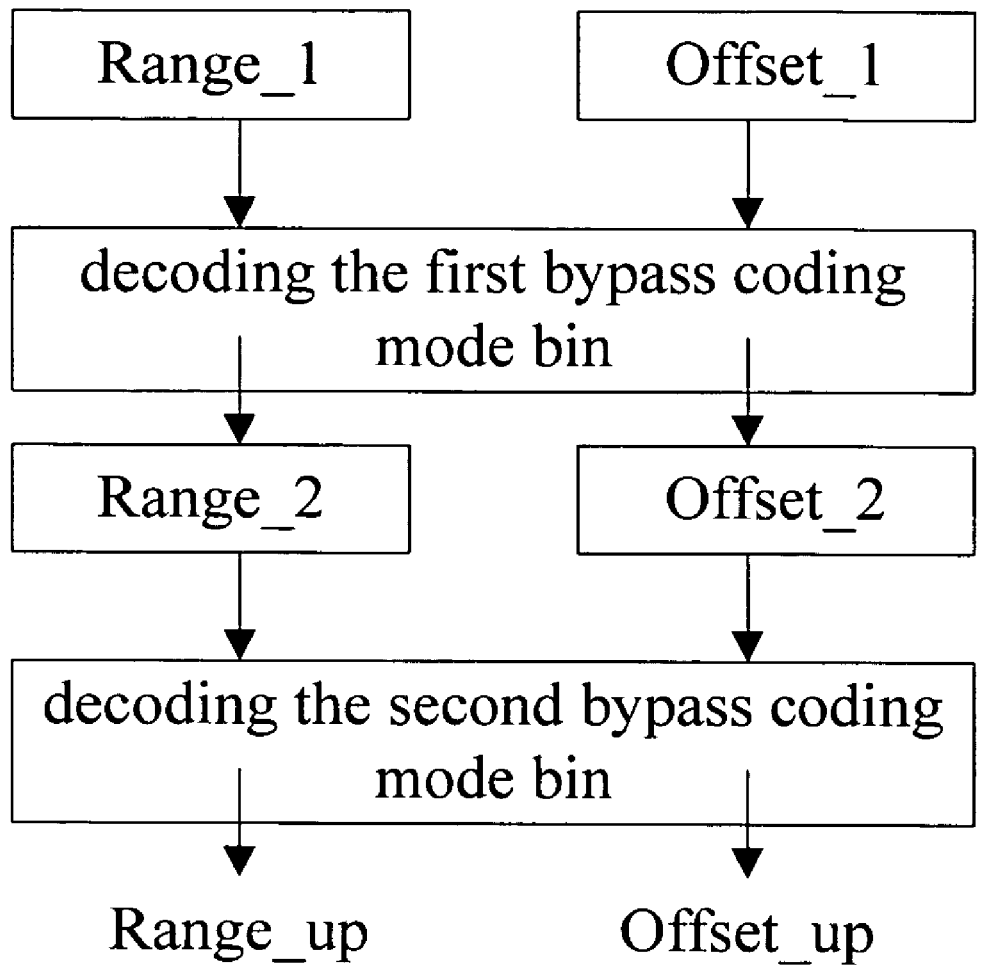
FIG. 4 is a schematic diagram showing a 2-level tree structure of concatenating 2 decoding units for decoding a single bypass coding mode bin according to an embodiment of the present invention.

The decoding process of the bypass coding mode bin shown in FIG. 2 is illustrated with the decoding of 2 bypass coding mode bins. The correlated 2-level tree structure that concatenates 2 units decoding a single bypass mode bin is shown in FIG. 4, the structure includes 2 decoding units, that is, the unit for decoding the first bypass bin and the unit for decoding the second bypass bin. The bypass mode decoding is much simpler than the decoding of regular coding mode.

It does not involve probability model information. Only comparison between the range and 2*offset is directly performed while decoding process, and if 2*offset>=range, the decoding result is 1, otherwise, the decoding result is 0. Furthermore, after the decoding process is completed, the renormalization procedure may be performed by left shifting offset by 1 bit, whereas keeping the value of range unchanged.

According to the embodiments of the present invention, to repeatedly use as less hardware resource as possible for decoding all the syntax elements, 4 decoding units are exemplarily illustrated herein (i.e., 2 units for decoding regular coding mode bins as in FIG. 1, and 2 units for decoding bypass mode bins as shown in FIG. 2). It will be appreciated that further more units or less may be employed. A group of control signals is introduced to adjust the tasks among the decoding units. Combined with the decoding bins they get, the decoding units determine the final output that includes the interval and offset information of the final output of a clap. In this way, the decoding of all syntax elements can be implemented through repeatedly using the 4 units.

Figure 5:
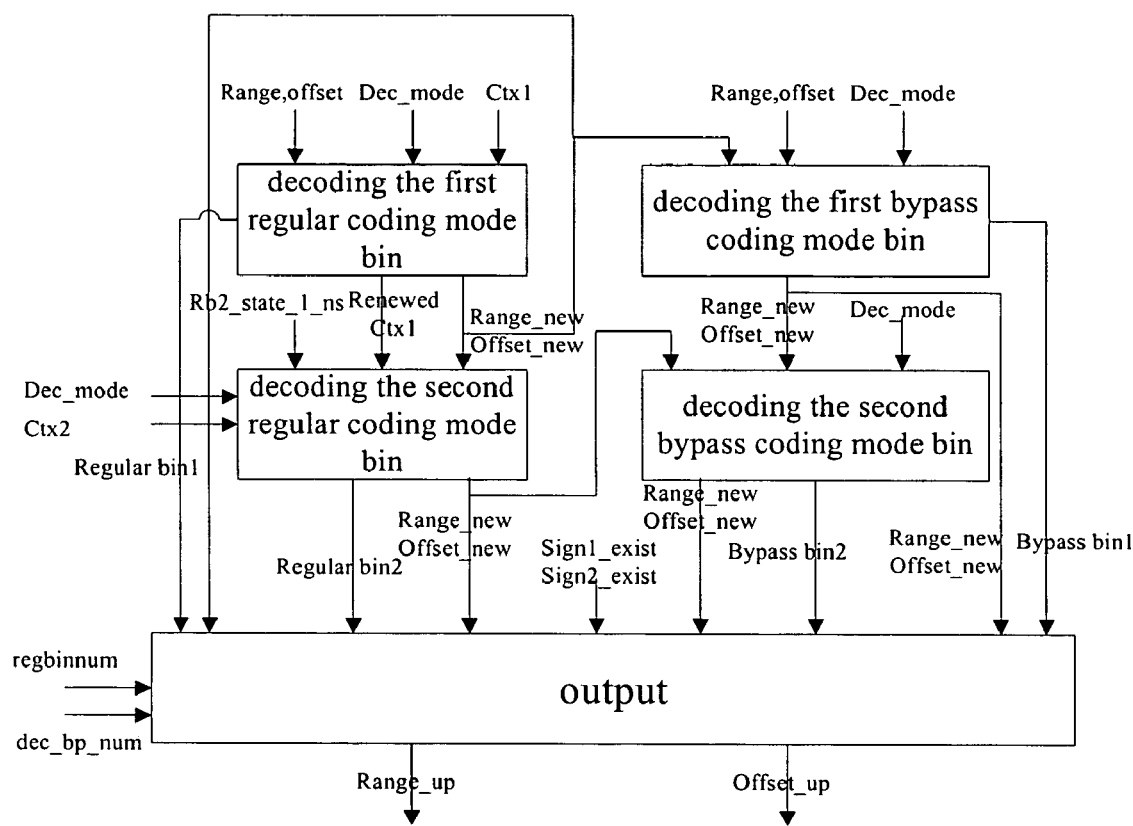
FIG. 5 is a schematic diagram showing to control 2 decoding units for regular coding mode bins and 2 decoding units for bypass coding mode bins with the control signals according to an embodiment of the present invention.

The sketching diagram of control signals controlling the 4 decoding units to decode is shown as in FIG. 5. FIG. 5 shows the four decoding units, which include: the unit for decoding the first regular coding mode bin, the unit for decoding the second regular coding mode bin, the unit for decoding the first bypass coding mode bin and the unit for decoding the second bypass coding mode bin.

In FIG. 5, the range and offset signals are the values of the range and offset as the input of the decoding clap, and the range_up and offset_up are the values of the range and offset as the output of the decoding clap. Ctx1 and Ctx2 are respectively corresponding to the two probability models that the 2 regular coding mode bins maybe use, wherein, Ctx2 is unused when the 2 bins share a probability model.

The Range_new and offset_new signals are respectively the updated values of the range and offset after a bin is decoded.

The Regular_bin1, Regular_bin2, Bypass_bin1, Bypass_bin2 signals are respectively the decoding output of each decoding single bin module.

All control signals include dec_mode, regbinnum, rb2_state_1_ns, sign1_exist, sign2_exist, and dec_bp_num.

Next, the functions and operations of the control signals are described respectively.

First, the control signal dec_mode (decoding mode), referred to as a first control signal will be discussed. This control signal has 2 bits and its value maybe 00, 01 or 10.

When dec_mode is 00, correspondingly, the current decoding clap needs to decode regular coding mode bins.

When dec_mode is 01 or 10, correspondingly, the current decoding clap needs to decode the suffix EG(Exp-Golomb code) obtained from the binarization of mvd and level, that is, perform the decoding of bypass coding mode bins. The EG includes its own prefix and suffix, and the values of dec_mode 01 and 10 are respectively corresponding to the decoding processes in the 2 cases. The prefix of EG is a unary code, that is, a code consists of several '1' and a '0', whose decoding finishes when the decoded bin is '0'; the total bin number of the EG suffix is determined by the number of '1' in the prefix of EG.

Thus, when the value of dec_mode is 10, another signal is required to determine the number of bypass coding mode bins to be decoded in the current decoding clap, that is the dec_bp_num. When the value of dec_mode is 01, the current decoding clap finishes when the value decoded from the bypass coding mode bin is 0.

Second, it will discuss the control signal 'regbinnum' (the number of regular coding mode bins to be decoded), which is referred to as a second control signal. This control signal has 1 bit. It is valid only when dec_mode is 00. Regbinnum being 1 indicates that the current decoding process is to decode a regular coding mode bin, that is to call a first branch of the 2-level tree structure that decodes 2 regular coding mode bins in one clap, and when regbinnum is 0, it will additionally call a second branch of the 2-level tree structure that decodes 2 regular coding mode bin in a whole clap. That is, according to the second control signal, it determines a current decoding unit and decoding process.

Regarding other syntax elements except the mvd, level and the map_last, the decoding of them is one cycle one bin, so the regbinnum is 1. For mvd, level and map_last, the decoding of them automatically finishes till 0 occurs. They all select the 2-level tree structure that decodes 2 regular coding mode bins in a whole clap, and regbinnum is 0.

Third, discuss the control signal rb2_state_1_ns (which controls the selection of the probability model for decoding the second regular bin), which is referred to as a third control signal. This control signal has 1 bit. It is valid when the 2-level tree structure that decodes 2 regular coding mode bins in a clap is selected. Its value indicates whether the context probability model for decoding the second regular coding mode bin is the same as the one for decoding the first regular coding mode bin, with 1 indicating the same context probability model.

Fourth, it will discuss the control signals of sign1_exist and sign2_exist, which are referred to as a fourth control signal (the control signals sign1_exist indicating whether the first unit for decoding regular bins concatenates a positive/negative sign, and the control signals sign2_exist indicating whether the second unit for decoding regular bins concatenates a positive/negative sign). The above control signals both have 1 bit and may indicate whether it is required to decode the positive/negative sign information in a clap when calling the 2-level tree structure decoding 2 regular coding mode bins in the clap. And if the decoding of the sign is required during the decoding of the prefix of mvd and level, sign1_exist and sign2_exist are all set to 1; if the decoding of the sign is not required during the decoding of map_last, sign1_exist and sign2_exist are all set to 0.

Fifth, discuss the control signal dec_bp_num (the number of the bypass mode bins to decode), which is referred to as a fifth control signal. This control signal has 1 bit. It is valid when dec_mode is 10, i.e., when decoding the suffix of EG, and is used to determine how many bypass coding mode bins are needed to decode in current decoding clap.

With the set of control signals above, the decoding of all syntax elements can be fulfilled by using 2 units decoding regular coding mode bins and 2 units decoding bypass coding mode bins. The decoding process of each clap can be determined, and a plurality of bins can be decoded in a clap synchronously.

To further describe the present invention, the possible cases of the combinations of the control signals and decoding unit circuits in FIG. 5 are particularized next.

The first case is the decoding of the prefix part of level or mvd.

In this case, dec_mode is 00, which indicates it is to decode regular coding mode bin in the current clap. Regbinnum is 0, indicating 2 branches of the tree a in FIG. 6 are selected in the current clap. If the decoding result of the first branch is 0, then no need to use the second branch; otherwise, transfer the output range_new and offset_new of the first branch into the second branch as input.

If it is not to decode the first clap of mvd or it is to decode level, the sign information is required to be added after decoding the mvd and level. Sign1_exist and sign2_exist now are all 1, indicating a bypass bin, i.e. the sign information, needs to be further decoded after decoding the absolute value.

If it is to decode the first clap of mvd, then the first branch of the tree a indicates that the decoding value of mvd is 0 without sign information. Entering the second branch indicates that the decoding value is larger than 0, so the control signal sign1_exist is 0 and sign2_exist is 1 in this clap. Rb2_state_1_ns is determined by the sequence number of the current decoding clap (that is, the sequence number of the decoding bin in mvd or level). Now dec_bp_num is invalid. In this case, the output of the first branch of tree a in FIG. 6 is the input of the first branch of tree b; the output of the second branch of tree a is the input of the second branch of tree b.

Further, if it is to decode the first clap of mvd, the processing of the output unit is as follows: if the decoded bin of the first branch of tree a is 0, then the final output range_new and offset_new is the output of the first branch of tree a; if the decoded bin of the second branch of tree a is 0, then a sign needs to be further decoded and the final output range_new and offset_new is the output of the second branch of tree b; if the decoded bin of the second branch of tree a is 1, then in the next clap continue to decode the absolute value, and the final output range_new and offset_new is the output of the second branch of tree a.

Furthermore, if it is to decode other claps of mvd except the first or it is to decode level, the processing of the output unit is: if the decoded bin of the first branch of tree a is 0, then a sign needs to be further decoded, and the final output range_new and offset_new is the output of the first branch of tree b; if the decoded bin of the second branch of tree a is 0, then a sign needs to be further decoded, and the final output range_new and offset_new is the output of the second branch of tree b; if the decoded bin of the second branch of tree a is 1, then continue to decode its absolute value in next clap, the final output rang_new and offset_new is the output of the second branch of tree a.

The second case is to decode the Golomb prefix of the suffix of level or mvd.

Here dec_mode being 01 indicates to decode bypass coding mode bin in current clap. regbinnum, sign1_exist, sign2_exist, rb2_state_1_ns and dec_bp_num are all invalid. In this case, the output of the first branch of tree b in FIG. 6 is the input of the second branch of tree b. The processing of the output unit is: if the decoded bin of the first branch of tree b is 0, then the final output range_new and offset_new is the output of the first branch of tree b, otherwise, the final output range_new and offset_new is the output of the second branch of tree b.

The third case is to decode the Golomb suffix of the suffix of the level or mvd.

Here dec_mode being 10 indicates to decode bypass coding mode bin in the current clap. regbinnum, sign1_exist, sign2_exist and rb2_state_1_ns are all invalid. Dec_bp_num is determined by the sequence number of the current decoding clap (that is, the sequence number of the bin being decoded of the suffix of the Golomb code). The processing of the output unit is: if dec_bp_num is 0, which indicates a bypass bin is decoded in the current clap, then the final output range_new and offset_new is the output of the first branch of tree b, otherwise, the final output range_new and offset_new is the output of the second branch of tree b.

The fourth case is to decode the map_last pair.

Here dec_mode is 00, indicating to decode regular coding mode bins in the current clap. Regbinnum is 0, indicating 2 branches of tree a in FIG. 6 are used in the current clap. If the decoded result of the first branch is 0, then the second branch is not used; otherwise, the output range_new and offset_new of the first branch are sent to the input interface of the second branch. This case is very similar with the case 1, except no sign information. So sign1_exist and sign2_exist are all 0. In this case rb2_state_1_ns is always 0, because the probability models for last and map are always different with each other. Dec_bp_num is invalid. The processing of the output unit is: if the decoded bin of the first branch of tree a is 0, then the final output range_new and offset_new is the output of the first branch of tree a, otherwise, the final output range_new and offset_new is the output of the second branch of tree a.

The fifth case is to decode bins of other syntax elements.

All the other syntax elements bins are regular coding mode bins, whose decoding is one cycle one bin. Here dec_mode is 00, indicating to decode regular coding mode bins in the current clap. Regbinnum is 1, indicating only the first branch of tree a in FIG. 6 is used in the current clap. The output unit process is: the final output range_new and offset_new is the output of the first branch of tree a.

The present invention is mainly illustrated with a 2 level tree structures above. Similarly the present invention can also use circuits with 3 or more level structures. Of course, the higher the level of the circuit design structure is, the deeper the combination circuit is, and the longer the key path is.

All above, the embodiments of the present invention may greatly improve the CABAC decoding rate compared with the existing CABAC kernel decoding schemes. Meanwhile, its cost of hardware resource is pretty reasonable.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A context-based adaptive binary arithmetic coding (CABAC) decoding system comprising
at least a decoding unit group, each of said at least a decoding unit group including N decoding units interconnected with each other, wherein
an $M^{th}$ decoding unit is configured to receive parameter information for decoding bins and bit streams to be decoded, decode the bins in the bit streams to be decoded, obtain a decoding result of the bins of a current decoding unit, and send updated parameter information to an $M+1^{th}$ decoding unit, where, N is an integer no smaller than 2, M is an integer that is no smaller than 1 but no larger than N−1.

2. The CABAC decoding system according to claim 1, wherein said at least a decoding unit group further includes an output unit,
the decoding result of the $M^{th}$ decoding unit bin and the updated parameter information being sent to said output unit, wherein
said output unit is configured for receiving control signals, decoding results and updated parameter information sent by the decoding units, selecting parameter information from the updated parameter information outputted by the decoding units, and selecting an output of said at least a decoding unit group from the updated parameter information by the control signals.

3. The CABAC decoding system according to claim 1, wherein said at least a decoding unit group includes
a unit group for decoding regular coding mode bins and/or a unit group for decoding bypass coding mode bins.

4. The CABAC decoding system according to claim 2, wherein said at least a decoding unit group includes
a unit group for decoding regular coding mode bins and/or a unit group for decoding bypass coding mode bins.

5. The CABAC decoding system according to claim 3, wherein said parameter information includes interval value, offset value and value of probability models of each decoding unit.

6. The CABAC decoding system according to claim 4, wherein said parameter information includes interval value, offset value and value of probability models of each decoding unit.

7. The CABAC decoding system according to claim 5, wherein when the decoding units include units for decoding regular coding mode bin, the $M^{th}$ unit for decoding regular coding mode bins outputs updated interval value and offset value, and sends the updated values to the $M+1^{th}$ unit for decoding regular coding mode bins as input interval and offset information.

8. The CABAC decoding system according to claim 6, wherein when the decoding units include units for decoding regular coding mode bin, the $M^{th}$ unit for decoding regular coding mode bins outputs updated interval value and offset value, and sends the updated values to the $M+1^{th}$ unit for decoding regular coding mode bins as input interval and offset information.

9. The CABAC decoding system according to claim 7, further comprising a renormalization processing module, for performing renormalization on the interval value and the offset value outputted by the $M^{th}$ unit for decoding regular coding mode bins, and sending the renormalized interval value and the offset value to the $M+1^{th}$ unit for decoding regular coding mode bins or bypass coding mode bins as input interval and offset information.

10. The CABAC decoding system according to claim 8, further comprising a renormalization processing module, for performing renormalization on the interval value and the offset value outputted by the $M^{th}$ unit for decoding regular coding mode bins, and sending the renormalized interval value and the offset value to the $M+1^{th}$ unit for decoding regular coding mode bins or bypass coding mode bins as input interval and offset information.

11. The CABAC decoding system according to claim 7, further comprising a multi-selector, of which an input is an updated probability model outputted by the $M^{th}$ unit for decoding regular coding mode bins and/or a new probability model, whereas an output is one selected from the two input probability models.

12. The CABAC decoding system according to claim 8, further comprising a multi-selector, of which an input is an updated probability model outputted by the $M^{th}$ unit for decoding regular coding mode bins and/or a new probability model, whereas an output is a one selected from the two input probability models.

13. The CABAC decoding system according to claim 5, wherein when the decoding units include units for decoding bypass coding mode bins, the updated interval and offset values outputted by the $M^{th}$ unit for decoding bypass coding mode bins or regular coding mode bins are sent to the $M+1^{th}$ unit for decoding bypass coding mode bins as input interval and offset values.

14. The CABAC decoding system according to claim 6, wherein when the decoding units include units for decoding bypass coding mode bins, the updated interval and offset values outputted by the $M^{th}$ unit for decoding bypass coding mode bins or regular coding mode bins are sent to the $M+1^{th}$ unit for decoding bypass coding mode bins as input interval and offset values.

15. The CABAC decoding system according to claim 1, wherein the decoding units are interconnected with each other by binary tree connections or serial connections.

16. The CABAC decoding system according to claim 2, wherein the decoding units are interconnected with each other by binary tree connections or serial connections.

17. A context-based adaptive binary arithmetic coding (CABAC) decoding method, implemented by at least a decoding unit group, each of said at least a decoding unit group including N decoding units interconnected with each other, said method comprising
receiving parameter information and control signals for decoding bins by an $M^{th}$ decoding unit, decoding an input bit stream to be decoded based on said parameter information, outputting a decoding result of the bins, and sending updated parameter information to an $M+1^{th}$ decoding unit;
where, N is an integer no smaller than 2, M is an integer no smaller than 1 but no larger than N−1.

18. The CABAC decoding method according to claim 17, further comprising
sending the decoding result and the updated parameter information of the $M^{th}$ decoding unit bin to an output unit, and
the output unit selecting parameter information from the updated parameter information outputted by the decoding units according to control signals and the bin decoding result, selecting output values of said at least a decoding unit group from the updated parameter information according to the control signals and the decoded bin value.

19. The CABAC decoding method according to claim 18, wherein the process of decoding comprises decoding regular coding mode bins and/or decoding bypass coding mode bins.

20. The CABAC decoding method according to claim 19, wherein said parameter information includes interval value, offset value and probability model values of each decoding unit.

21. The CABAC decoding method according to claim 20, further comprising:
the decoding unit determining whether the decoding is processed on regular coding mode bins or bypass coding mode bins according to a first control signal.

22. The CABAC decoding method according to claim 21, further comprising
determining a decoding unit that is performing decoding currently according to a second control signal, when decoding regular coding mode bins.

23. The CABAC decoding method according to claim 22, further comprising
the decoding unit determining whether to select the updated probability model of the $M_{th}$ bin decoding unit or the new probability model as the probability model for the $M+1^{th}$ bin for decoding according to a third control signal.

24. The CABAC decoding method according to claim 18, further comprising
   calculating out the updated probability model of the $M^{th}$ decoding unit while performing decoding by the $M^{th}$ decoding unit;
   obtaining probability model index information based on said updated probability model; and
   selecting one model index information from the updated probability model index information obtained after decoding by the $M^{th}$ decoding unit and probability model index information inputted from outside as the updated probability model index information required by the $M+1^{th}$ decoding unit.

25. The CABAC decoding method according to claim 23, further comprising
   the decoding unit determining whether to decode positive and negative sign information in current decoding period according to a fourth control signal.

26. The CABAC decoding method according to claim 21, wherein when the decoding unit is determined to decode bypass coding mode bins, the method further comprises
   determining to decode a prefix or a suffix of Exp-Golomb code according to the value of the first control signal, wherein
      if decoding the prefix, the decoding process finishes when the decoded value of the bypass mode bin is 0;
      if decoding the suffix, determine the number of the bypass coding mode bins to be decoded according to a fifth control signal that is introduced to determine the number of the bypass coding mode bins to be decoded in the current decoding clap.

27. The CABAC decoding method according to claim 17, wherein
   during the decoding process of bins, the decoding result includes sign information if there is a sign to be decoded.

28. The CABAC decoding method according to claim 18, wherein
   during the decoding process of bins, the decoding result includes sign information if there is a sign to be decoded.

29. The CABAC decoding method according to claim 21, further comprising
   performing renormalization on the updated interval and offset values by a renormalization processing module, and
   obtaining the renormalized interval and offset values as a final updated values of the decoding unit to be interval and offset values of inputs of other decoding units in a same clap or a final output value in the clap.

30. The CABAC decoding method according to claim 17, wherein the N decoding units are interconnected with each other by binary tree connections or serial connections.

31. The CABAC decoding method according to claim 18, wherein the N decoding units are interconnected with each other by binary tree connections or serial connections.

* * * * *